US006348709B1

(12) United States Patent
Graettinger et al.

(10) Patent No.: US 6,348,709 B1
(45) Date of Patent: *Feb. 19, 2002

(54) ELECTRICAL CONTACT FOR HIGH DIELECTRIC CONSTANT CAPACITORS AND METHOD FOR FABRICATING THE SAME

(75) Inventors: Thomas M. Graettinger, Boise; F. Daniel Gealy, Kuna, both of ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/268,176

(22) Filed: Mar. 15, 1999

(51) Int. Cl.$^7$ .................. H01L 27/108; H01L 29/74; H01L 31/119; H01L 23/48
(52) U.S. Cl. .................. 257/311; 257/310; 257/751
(58) Field of Search .................. 257/296, 298, 257/303, 304, 306, 308, 310, 311, 751, 767, 763; 438/238, 239, 386, 399, 244, 253, 387, 396

(56) References Cited

U.S. PATENT DOCUMENTS

| | | | | |
|---|---|---|---|---|
| 4,963,511 A | * | 10/1990 | Smith | 438/668 |
| 5,032,233 A | * | 7/1991 | Yu et al. | 438/662 |
| 5,187,638 A | * | 2/1993 | Sandhu et al. | 361/313 |
| 5,292,677 A | * | 3/1994 | Dennison | 438/396 |
| 5,346,844 A | * | 9/1994 | Cho et al. | 438/253 |
| 5,362,666 A | * | 11/1994 | Dennison | 438/396 |
| 5,387,550 A | * | 2/1995 | Cheffings et al. | 438/643 |
| 5,504,038 A | * | 4/1996 | Chien et al. | 438/647 |
| 5,510,651 A | * | 4/1996 | Maniar et al. | 257/751 |
| 5,596,221 A | * | 1/1997 | Honda | 257/588 |
| 5,610,099 A | * | 3/1997 | Stevens et al. | 438/626 |
| 5,612,574 A | * | 3/1997 | Summerfelt et al. | 257/783 |
| 5,644,166 A | * | 7/1997 | Honeycutt et al. | 257/754 |
| 5,717,250 A | * | 2/1998 | Schuele et al. | 257/754 |
| 5,731,242 A | * | 3/1998 | Parat et al. | 438/586 |
| 5,793,076 A | * | 8/1998 | Fazan et al. | 257/298 |
| 5,801,916 A | * | 9/1998 | New | 361/321.4 |
| 5,854,104 A | * | 12/1998 | Onishi et al. | 438/240 |
| 5,929,526 A | * | 7/1999 | Srinivasan et al. | 257/768 |
| 5,972,747 A | * | 10/1999 | Hong | 438/235 |
| 5,989,952 A | * | 11/1999 | Jen et al. | 438/253 |
| 6,043,529 A | * | 3/2000 | Hartner et al. | 257/306 |
| 6,066,541 A | * | 5/2000 | Hsieh et al. | 438/397 |

FOREIGN PATENT DOCUMENTS

| | | | | |
|---|---|---|---|---|
| JP | 6-196439 | * | 7/1994 | |
| WO | WO 98/15013 | * | 4/1998 | H01L/29/92 |

* cited by examiner

*Primary Examiner*—Tom Thomas
*Assistant Examiner*—Shouxlang Hu
(74) *Attorney, Agent, or Firm*—Knobbe, Martens, Olson and Bear, LLP.

(57) ABSTRACT

An electrical contact includes a non-conductive spacer surrounding conductive plug material along the full height of the contact. The spacer inhibits oxide and other diffusion through the contact. In the illustrated embodiment, the contact includes metals or metal oxides which are resistant to oxidation, and additional conductive barrier layers. The contact is particularly useful in integrated circuits which include high dielectric constant materials.

40 Claims, 11 Drawing Sheets

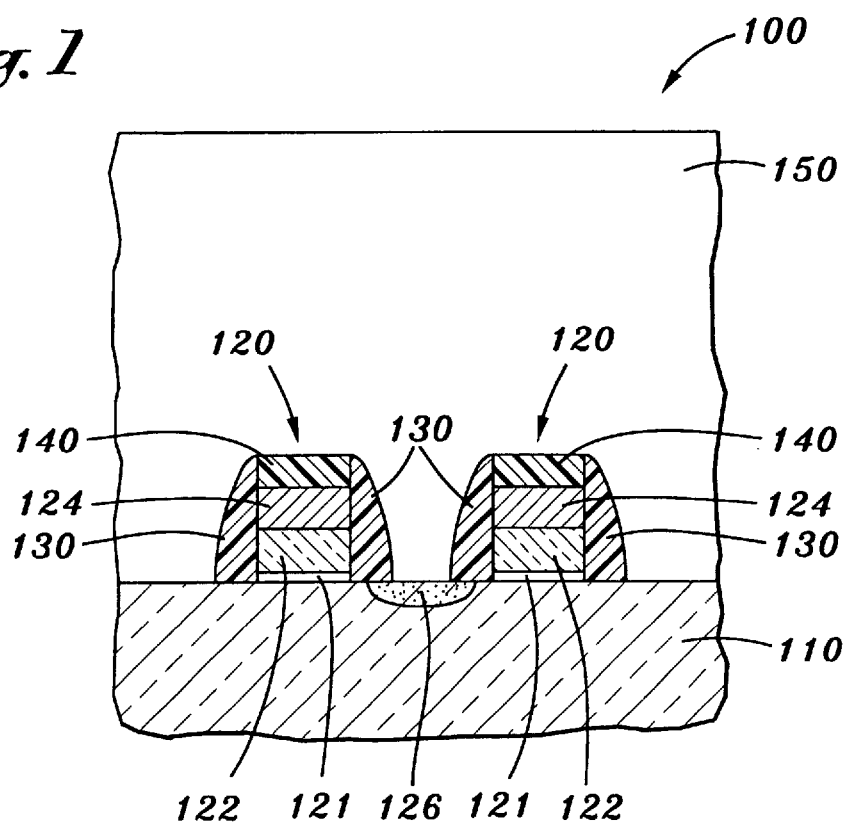
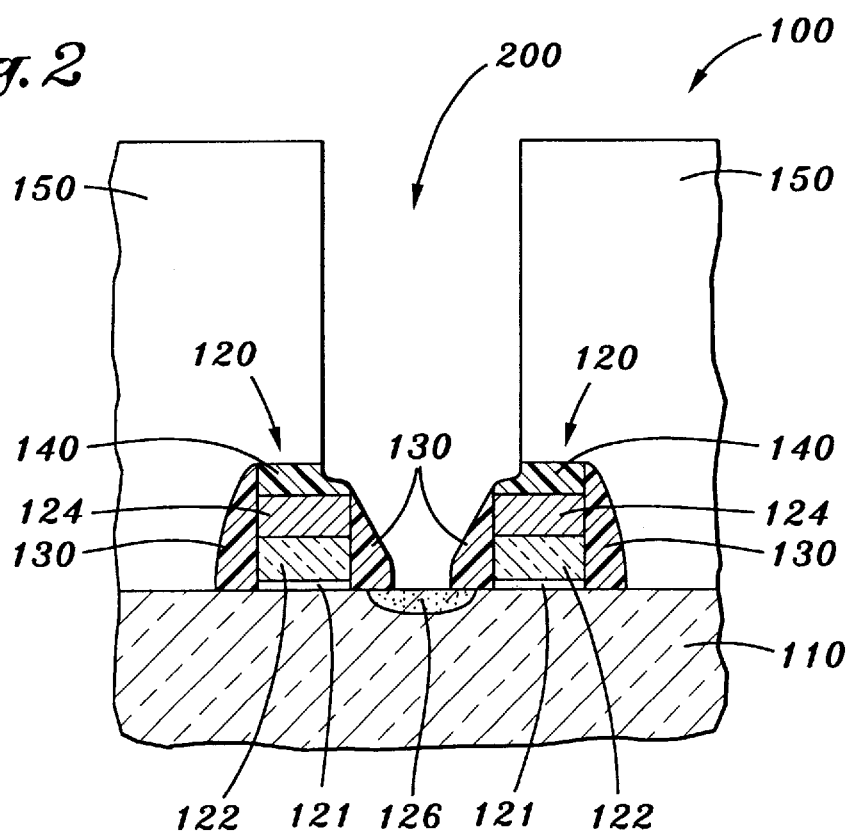

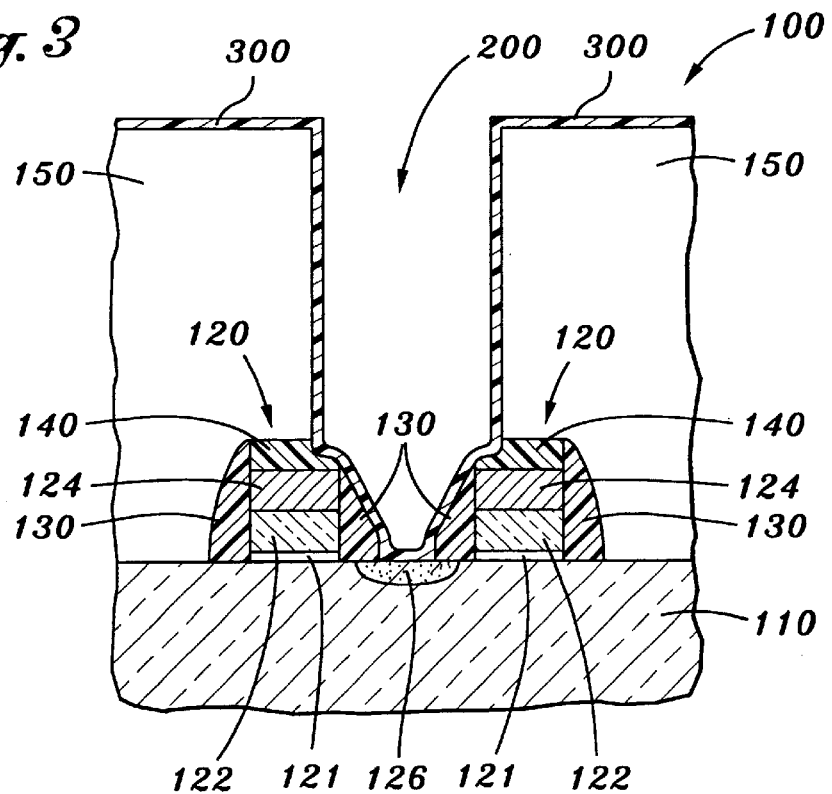
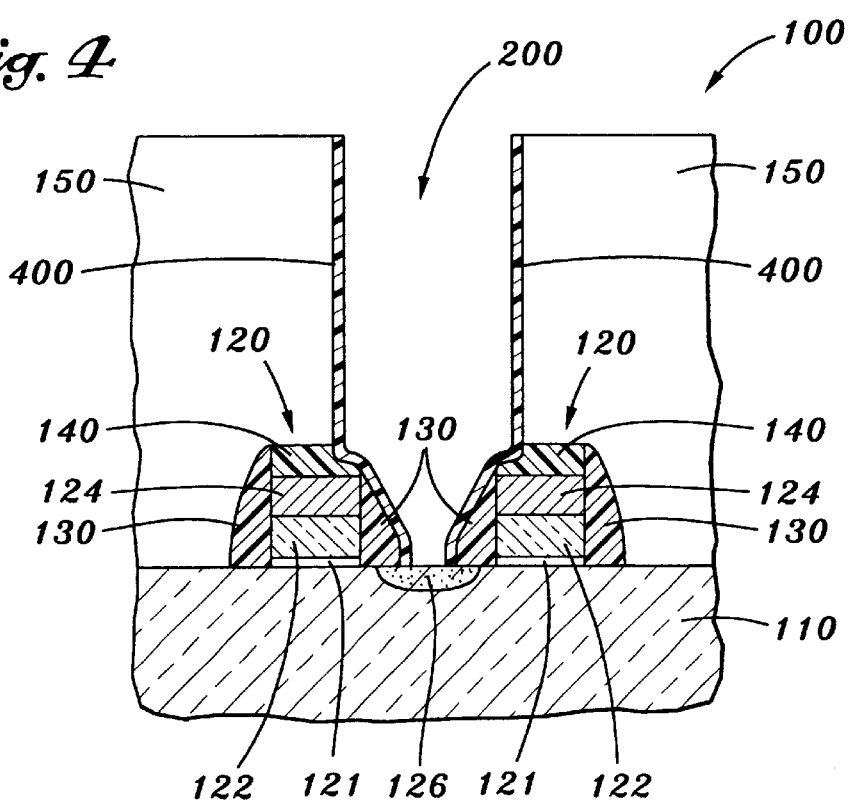

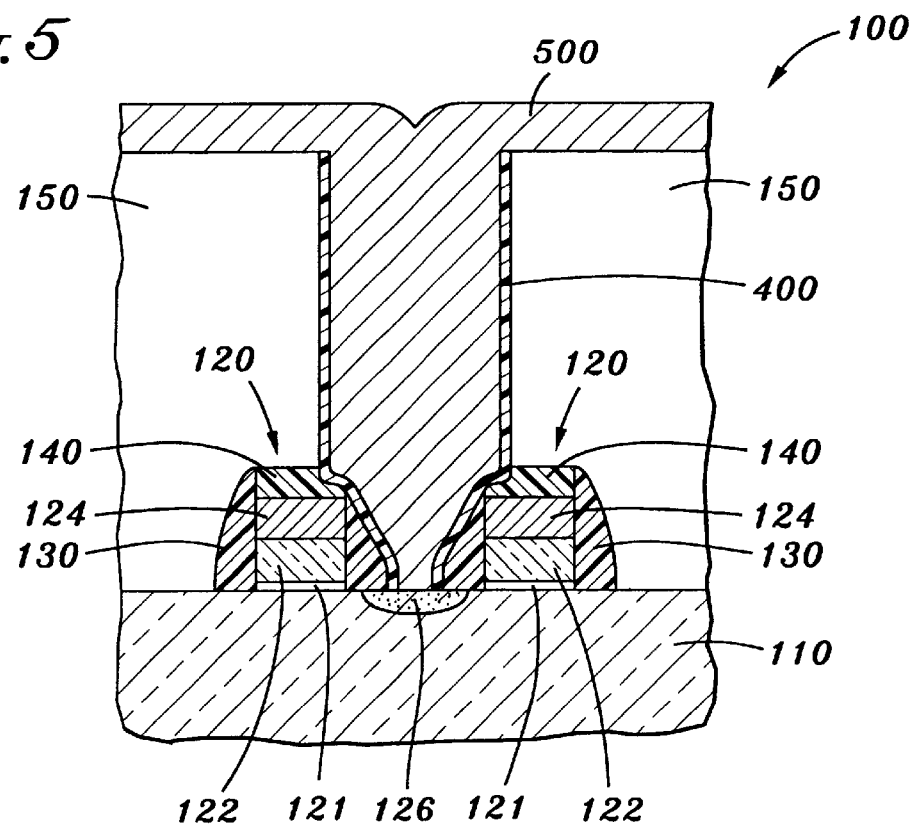
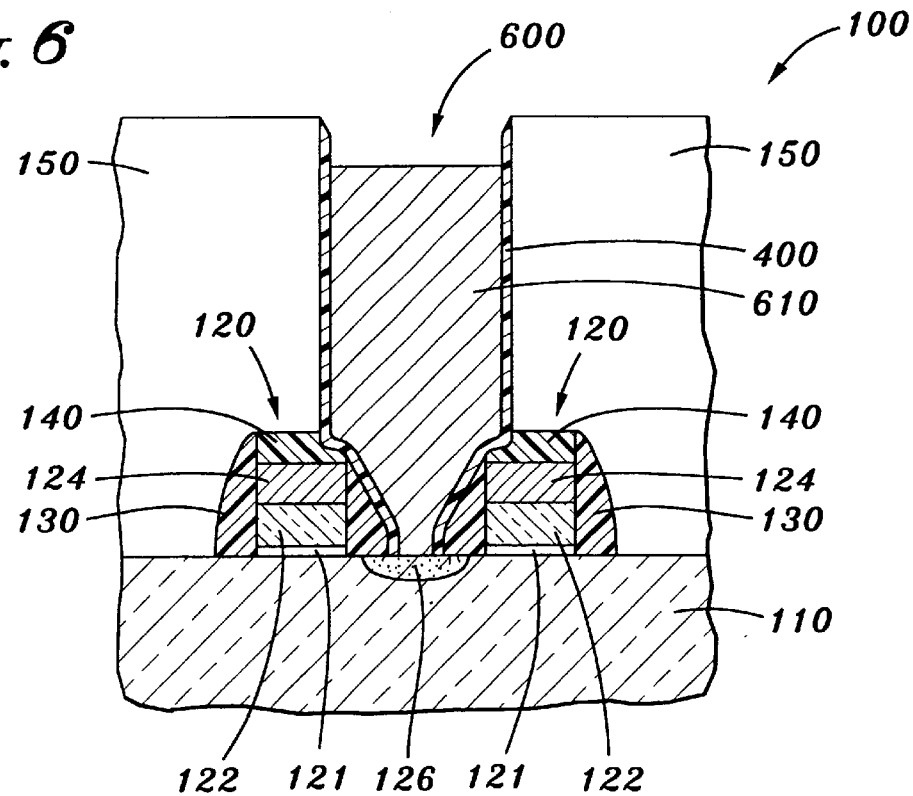

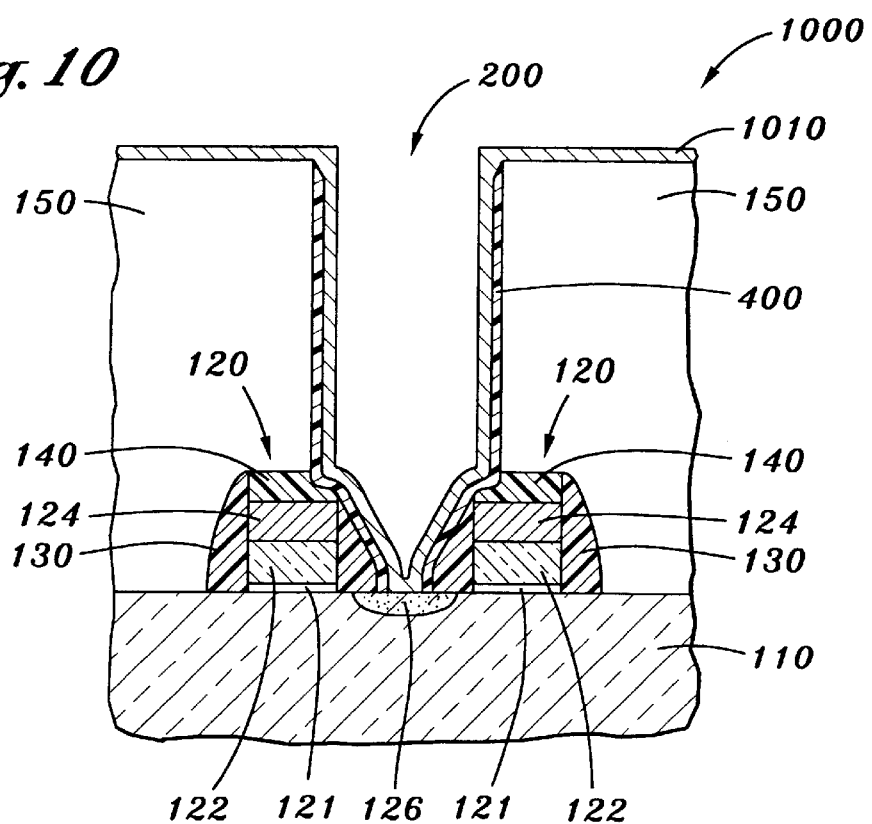
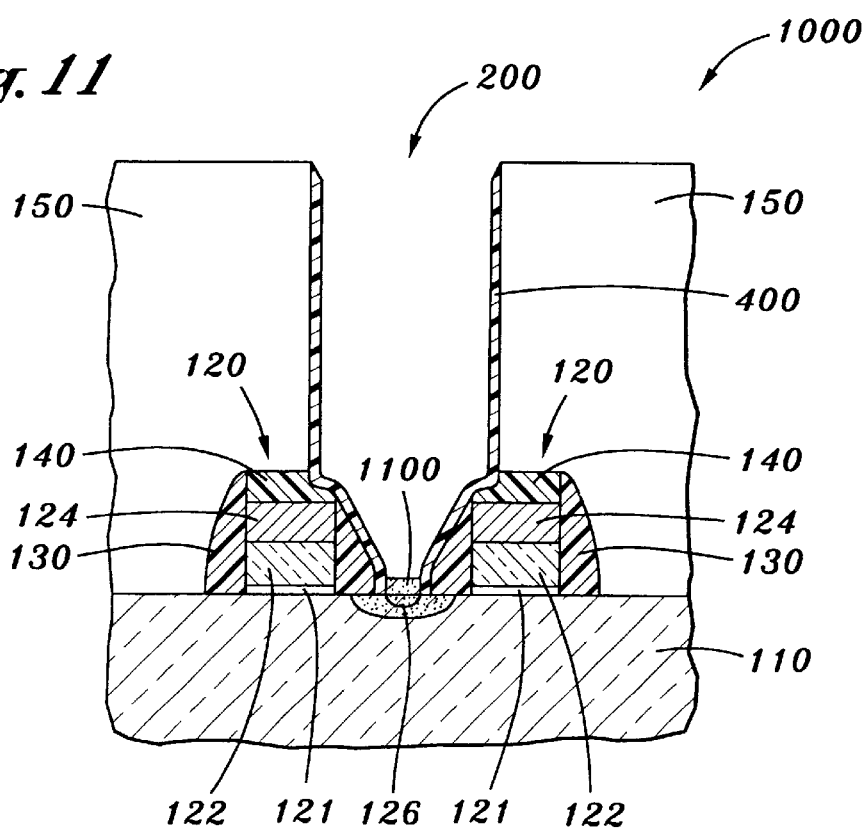

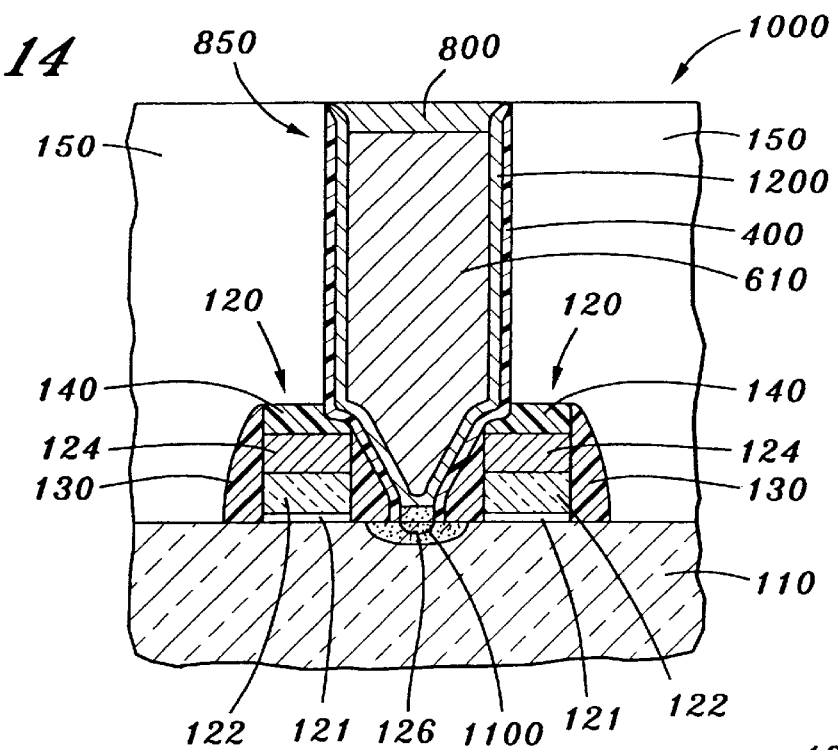
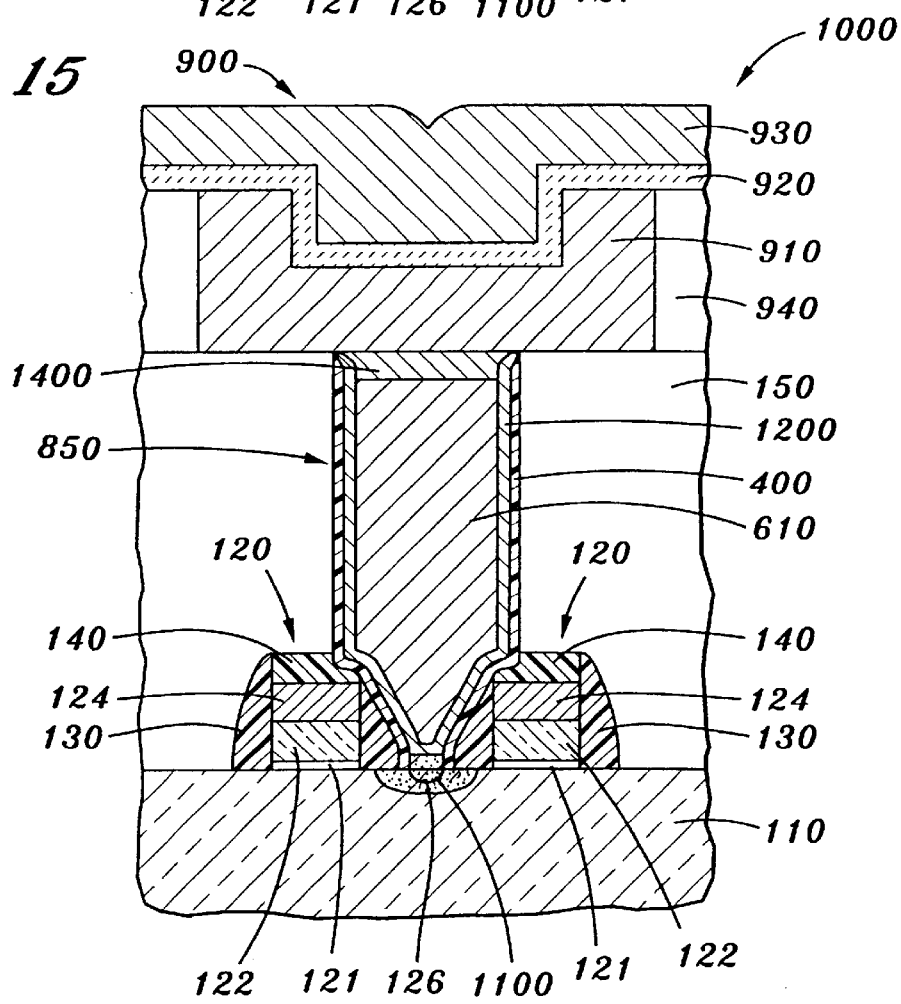

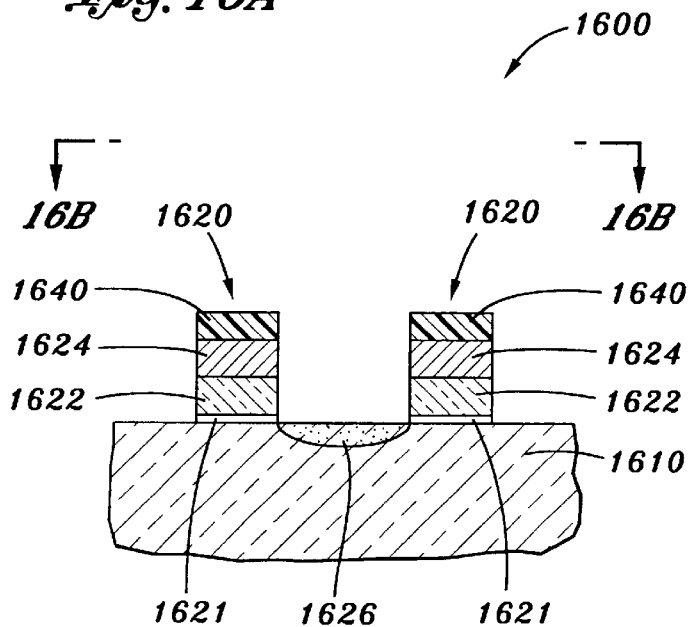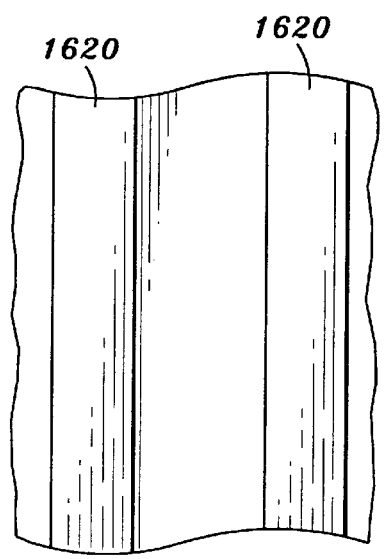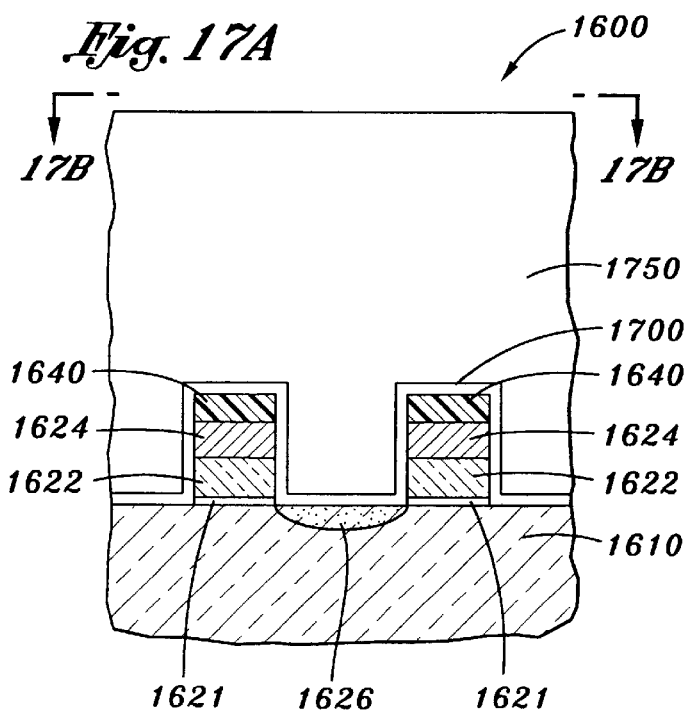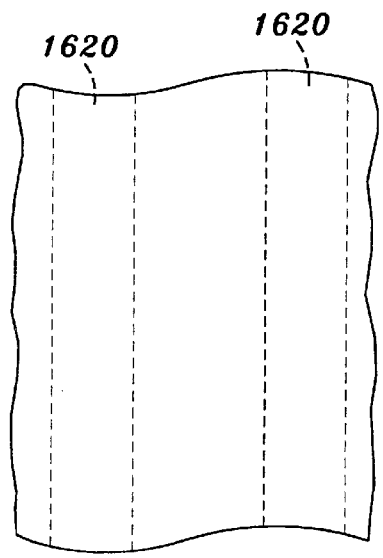

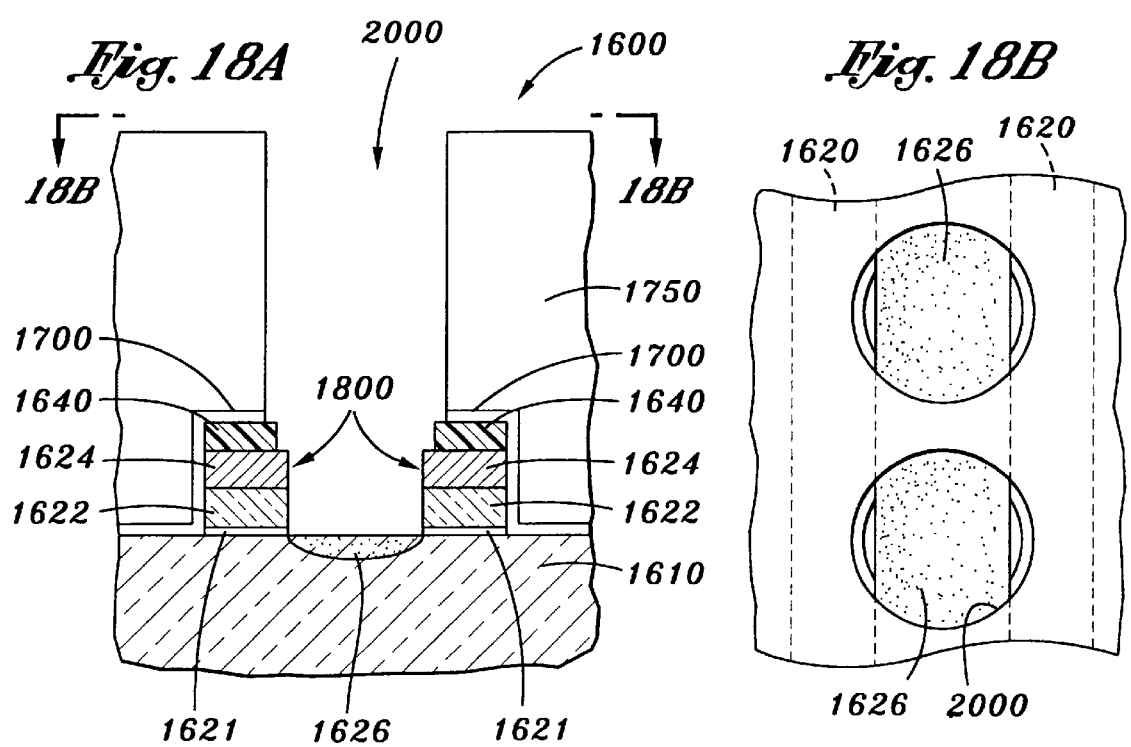
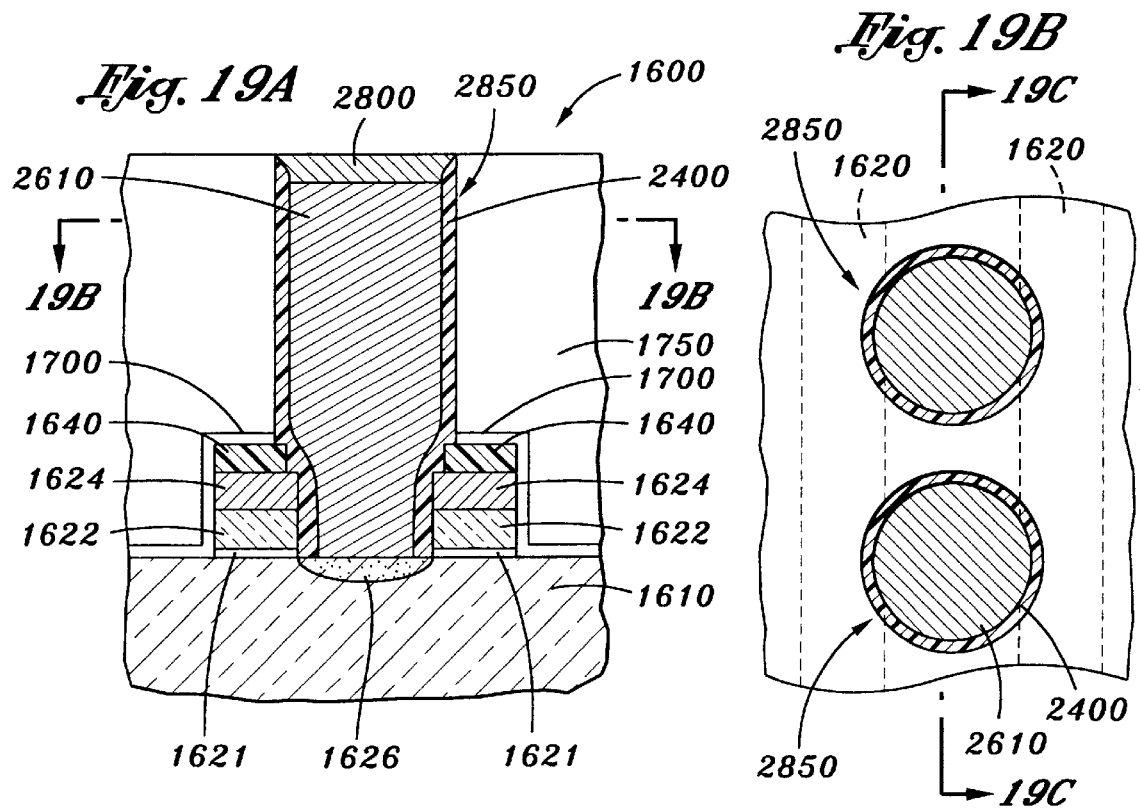

ELECTRICAL CONTACT FOR HIGH DIELECTRIC CONSTANT CAPACITORS AND METHOD FOR FABRICATING THE SAME

FIELD OF THE INVENTION

The present invention relates generally to integrated circuit fabrication, and more particularly to electrical contacts to capacitors which incorporate high dielectric constant materials.

BACKGROUND OF THE INVENTION

A memory cell in an integrated circuit, such as a dynamic random access memory (DRAM) array, typically comprises a charge storage capacitor (or cell capacitor) coupled to an access device such as a Metal Oxide Semiconductor Field Effect Transistor (MOSFET). The MOSFET functions to apply or remove charge on the capacitor, thus effecting a logical state defined by the stored charge. The amount of charge stored on the capacitor is proportional to the capacitance C, defined by $C=kk_0A/d$, where k is the dielectric constant of the capacitor dielectric, $k_0$ is the vacuum permittivity, A is the electrode surface area and d is the distance between electrodes.

The footprint allotted to memory cells is continually being reduced as integrated circuits are scaled down in pursuit of faster processing speeds and lower power consumption. Fabrication costs per unit of memory can also be reduced by increasing packing density, as more cells (each representing a bit of memory) can be simultaneously fabricated on a single wafer. As the packing density of memory cells continues to increase, each capacitor must maintain a certain minimum charge storage to ensure reliable operation of the memory cell. It is thus increasingly important that capacitors achieve a high stored charge per footprint or unit of chip area occupied.

Several techniques have recently been developed to increase the total charge capacity of the cell capacitor without significantly affecting the chip area occupied by the cell. These techniques include increasing the effective surface area A of the capacitor electrodes by creating three-dimensional folding structures, such as trench or stacked capacitors.

Other techniques concentrate on the use of new dielectric materials and ferroelectrics having higher permittivity or dielectric constant k. Such materials include tantalum oxide ($Ta_2O_5$), barium strontium titanate (BST), strontium titanate (ST), barium titanate (BT), lead zirconium titanate (PZT), and strontium bismuth tantalate (SBT). These materials are characterized by effective dielectric constants significantly higher than conventional dielectrics (e.g., silicon oxides and nitrides). Whereas k=3.9 for silicon dioxide, in these materials, k can range from 20–40 ($Ta_2O_5$) to greater than 100, with some materials having k exceeding 300 (e.g., BST). Using such materials enables the creation of much smaller and simpler capacitor structures for a given stored charge requirement, enabling the packing density dictated by future circuit design.

However, difficulties have been encountered in incorporating the high k materials into conventional fabrication flows. For example, $Ta_2O_5$ is deposited by chemical vapor deposition (CVD) employing a highly oxidizing ambient. Furthermore, after deposition, the high k materials must be annealed to remove carbon and/or crystallize the material. This anneal is also typically conducted in the presence of a highly oxidizing ambient to ensure maintenance of the appropriate oxygen content in the dielectric. Depletion of oxygen would essentially leave metallic current leakage paths through the capacitor dielectric, leading to failure of the cell. Both the deposition and anneal may subject surrounding materials to degradation. For example, polycrystalline silicon (polysilicon) plugs beneath the high k materials are subject to oxidation.

Such oxidation is not limited to immediate surrounding materials. Rather, such oxidation may diffuse directly through an insulating layer (e.g., borophosphosilicate glass or BPSG) and degrade the polysilicon contact plug, the conductive digit/word lines, or even the silicon substrate itself. Oxidation of any of these structures reduces their conductivity and is viewed as a major obstacle to incorporating high k materials into integrated circuits. While replacing silicon with non-oxidizing materials prevents degradation of the plug itself, such materials are expensive and many tend to allow oxygen diffusion through them to other oxidizable elements.

Thus, a need exists for a memory cell structure which includes a semiconductor device, an electrical contact and a memory cell capacitor, and which reliably integrates high dielectric constant materials into the process flow.

SUMMARY OF THE INVENTION

In accordance with one aspect of the invention, an electrical contact is formed between a memory cell capacitor and the silicon substrate. The electrical contact includes a contact plug surrounded by a silicon nitride spacer. The spacer advantageously protects the contact plug and the silicon substrate from oxidizing environments, such as the environment present during subsequent processing of a high dielectric capacitor, and from other bi-directional diffusion.

In accordance with another aspect of the invention, the contact plug comprises CVD transition metals or CVD transition metal oxides. The contact plugs advantageously resist high temperatures and highly oxidizing environments, such as the environment present during fabrication of the high dielectric capacitor.

In accordance with yet another aspect of the invention, the electrical contact is formed in a process which eliminates the need for spacers along word lines. Therefore, the extra processing steps required to produce such digit line spacers may be avoided and contact footprint is effectively expanded. Therefore, the electrical contact advantageously reduces cost and complexity of the process flow while also allowing for increased density of memory cells.

Other aspects and advantages of the invention will be apparent from the detailed description below and the appended claims.

BRIEF DESCRIPTION OF THE DRAWINGS

The present invention is described in more detail below in connection with the attached drawings, which are meant to illustrate and not to limit the invention, and in which:

FIG. 1 is a schematic cross-section of a partially fabricated memory cell, in accordance with a preferred embodiment;

FIG. 2 shows the memory cell of FIG. 1 after a contact hole is etched through an interlevel dielectric;

FIG. 3 shows the memory cell of FIG. 2 after deposition of a spacer material;

FIG. 4 shows the memory cell of FIG. 3 after a spacer etch;

FIG. 5 shows the memory cell of FIG. 4 after deposition of a conductive filler material;

FIG. 6 shows the memory cell of FIG. 5 after an etch back or recess step, to leave a contact plug within the contact hole;

FIG. 10 is a schematic cross-section of a partially fabricated memory cell in accordance with a second preferred embodiment, illustrating a refractive metal layer deposited over a structure similar to that of FIG. 4;

FIG. 11 shows the memory cell of FIG. 10 after a self-align silicidation process;

FIG. 14 shows the memory cell of FIG. 13 after deposition and etch back of a barrier cap;

FIG. 15 shows the memory cell of FIG. 14 after fabrication of a memory cell capacitor over the contact plug;

FIG. 16A is a schematic cross-section of a partially fabricated memory cell in accordance with a third preferred embodiment, showing digit or word lines over a semiconductor substrate;

FIG. 16B is a top down sectional view, taken along lines 16B—16B of FIG. 16A;

FIG. 17A shows the memory cell of FIG. 16A after insulating layers are formed over the word lines;

FIG. 17B is a top down sectional view, taken along lines 17B—17B of FIG. 17A;

FIG. 18A shows the memory cell of FIG. 17A after contact holes are etched through the insulating layers;

FIG. 18B is a top down sectional view, taken along lines 18B—18B of FIG. 18A;

FIG. 19A shows the memory cell of FIG. 18 after formation of spacers, contact plugs, and barrier layers, similar to the steps of FIGS. 3–8;

FIG. 19B is a top down sectional view, taken along lines 19B—19B of FIG. 19A.

DETAILED DESCRIPTION OF THE PREFERRED EMBODIMENT

Figure 7:
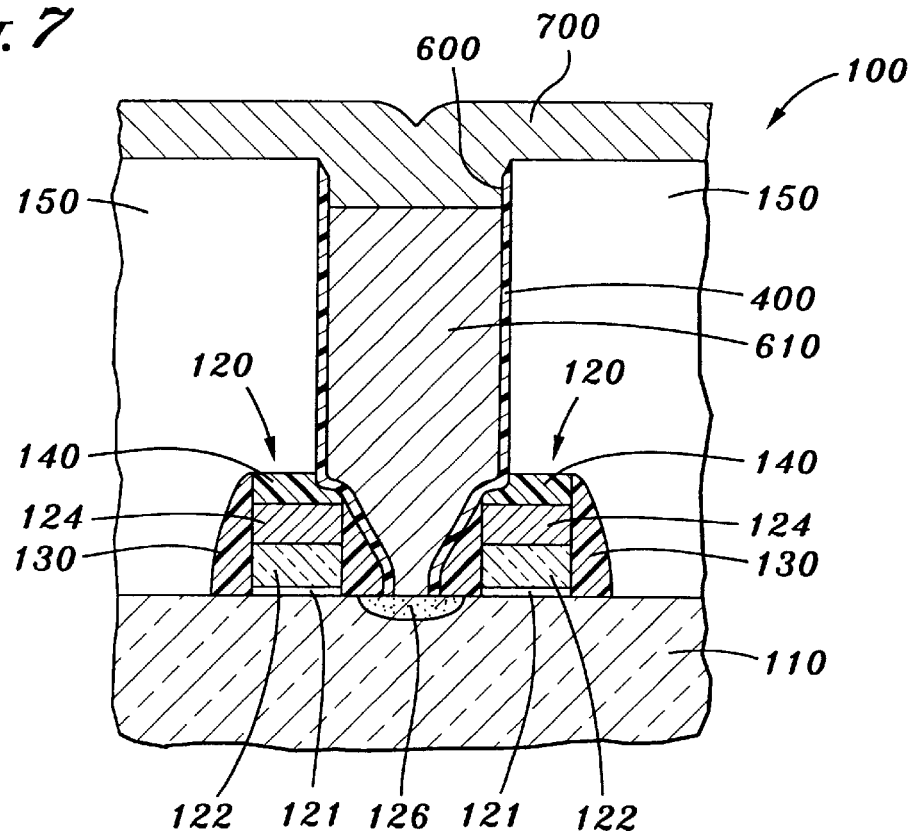
FIG. 7 shows the memory cell of FIG. 6 after a top barrier layer has been deposited.

While illustrated in the context of a contact to substrate in a memory cell, the skilled artisan will find application for the materials and processes disclosed herein in a wide variety of contexts. The disclosed electrical contacts have particular utility in fabrication process flows which include highly oxidizing environments.

FIG. 1 schematically illustrates a partially fabricated memory cell 100 formed over and within a semiconductor substrate 110. While the illustrated silicon substrate 110 comprises an intrinsically doped monocrystalline silicon wafer, it will be understood by one of skill in the art of semiconductor fabrication that the "substrate" in other arrangements can comprise other forms of semiconductor layers which include active or operable portions of integrated devices.

In the illustrated first preferred embodiment, a plurality of transistor gate stacks 120 each include a gate dielectric 121, a polysilicon layer 122, and a conductive strap 124. The polysilicon layer 122 serves as the transistor gate electrode, while the strap 124, typically a metal or metal silicide, facilitates highly conductive digit or word line propagation. Doped transistor active areas 126 are formed in the substrate 110 between gate stacks 120.

The gate stacks 120 are insulated from surrounding electrical elements by sidewall spacers 130, conventionally formed by deposition and spacer etch, and protective caps 140, generally formed above the gate electrodes 120 prior to spacer formation. The spacers 130 and caps 140 preferably comprise silicon nitride. It will be understood, however, that other materials are suitable for electrically insulating the gate electrodes from surrounding elements, and for protecting the gate electrodes from the subsequent etching processes, as discussed with reference to FIG. 2.

Generations of integrated circuits are generally referred to by the spacing distance between the gate electrodes, also known as the critical dimension. In the illustrated embodiments, the gate electrodes are separated by less than about 0.40 $\mu$m. When the distance between the gate electrodes is less than about 0.25 $\mu$m, the circuitry and processing therefor is referred to as sub-quarter micron technology. In the illustrated embodiment, dimensions and process parameters will be given for quarter micron technology unless explicitly stated otherwise. Current processing technology has advanced to 0.20 $\mu$m and even 0.18 $\mu$m gate spacing. Future generations are anticipated to employ gate spacings of 0.15 $\mu$m, 0.13 $\mu$m, 0.10 $\mu$m, etc. As described in the Background section above, as circuitry shrinks, progressively smaller real estate or footprint is allotted to each feature in the integrated circuit.

Also shown in FIG. 1 is a thick insulating layer or interlevel dielectric (ILD) 150 covering the silicon substrate 110, the gate electrodes 120, the spacers 130, and the caps 140. Typically, the ILD 150 comprises a form of oxide, and is borophosphosilicate glass (BPSG) in the illustrated embodiment. Depending upon the presence or absence of other circuit elements, the ILD 150 has a preferred thickness of about 4,000 Å to 5,000 Å. For 0.15 $\mu$m technology, the ILD 150 will preferably be about 3,000 Å to 4,000 Å.

FIG. 2 schematically illustrates the partially fabricated memory cell 100 having a contact via or hole 200 etched through the ILD 150. The contact hole 200 can be formed by conventional photolithographic techniques and etch. The depth of the contact hole 200 is dictated by the thickness of the ILD 150, while the width of the hole 200 is preferably wider than the distance between gate electrodes 120. Where the gate spacing is about 0.25 $\mu$m, the contact hole 200 is preferably about 0.40 $\mu$m wide and about 4,000 Å to 5,000 Å deep. As is well known in the art, the contact via 200 is selectively etched relative to the protective spacers 130 and cap layer 140, such that the contact hole is said to be self-aligned. In other words, the mask defining the hole 200 need not be precisely aligned with and may be wider than the gate spacing, as shown. The caps 140 and spacers 130 are only slightly etched by the selective chemistry, as shown.

FIG. 3 schematically illustrates the partially fabricated memory cell 100 having spacer material 300 deposited in the contact hole 200 and over the ILD 150. The spacer material 300 comprises an effective barrier against oxygen diffusion, and is preferably insulating. In the illustrated embodiment, the spacer material 300 comprises silicon nitride (SiN), desirably in a stochiometric or near-stoichiometric form ($Si_3N_4$). SiN is preferably deposited using a low-pressure chemical vapor deposition (LPCVD). LPCVD is preferred for conformal lining of the vertical walls of the contact hole 200, though the skilled artisan will recognize other suitable deposition techniques.

The thickness of deposited spacer material 300 depends on the particular properties of the spacer material 300, and upon design and operational considerations. The lower limit is governed by desired barrier functions. For example, the spacers may need to serve as a barrier against diffusion of oxygen, dopants, etc. The spacer material may also serve to electrically isolate the gate stacks 120 from the contact to be formed. The upper limit of deposition thickness is governed by the width of the contact hole 200. The contact hole 200 has a limit on how much spacer material 300 can be deposited, while leaving room for conductive material of adequately low resistivity to function as an electrical contact. Preferably, the illustrated silicon nitride spacer material 300 has a thickness between about 30 Å and 350 Å, more preferably between about 50 Å and 150 Å.

FIG. 4 schematically illustrates the partially fabricated memory cell 100 after a spacer etch is conducted on the spacer material 300, forming sidewall spacers 400 along the vertical via sidewalls. As is known in the art, a spacer etch is a directional or anisotropic etch, preferentially etching exposed horizontal surfaces. Preferably less than about 10% of the thickness of the vertical portions of the spacer material 300 is lost during this process. Most preferably, a reactive ion etch (RIE) is employed, though purely physical sputter etch is also contemplated.

FIG. 5 schematically illustrates the partially fabricated memory cell 100 having conductive material 500 deposited into the contact hole 200 and over the ILD 150, thus filling the hole 200. The conductive material 500 can comprise conventional plug materials, such as CVD polysilicon or tungsten, but preferably comprises an oxidation-resistant material, such as a transition metal or metal oxide. Suitable transition metals include platinum (Pt), rhodium (Rh), palladium (Pd), iridium (Ir), and ruthenium (Ru). Conductive metal oxides include iridium oxide ($IrO_2$) and ruthenium dioxide ($RuO_2$). Most preferably, the conductive material is deposited by chemical vapor deposition.

FIG. 6 schematically illustrates the partially fabricated memory cell 100 after the contact plug material 500 has been etched back. Advantageously, an RIE preferentially etches horizontal surfaces and forms a recess 600, leaving a plug portion 610 of the conductive filler 500 therebelow. The skilled artisan will recognize other etch back processes. For example, chemical-mechanical planarization or polishing (CMP) can remove horizontal surfaces and stop on the underlying ILD 150.

FIG. 7 schematically illustrates the partially fabricated memory cell 100 having a conductive barrier material 700 deposited in the recess 600 and over the ILD 150. In the illustrated embodiment, the barrier material 700 comprises titanium nitride (TiN). Alternative conductive barriers include TiAlN and PtRh. The barrier material 700 is also preferably deposited using CVD techniques, although other techniques, including physical vapor deposition and spin-on deposition, may also be suitable.

Figure 8:
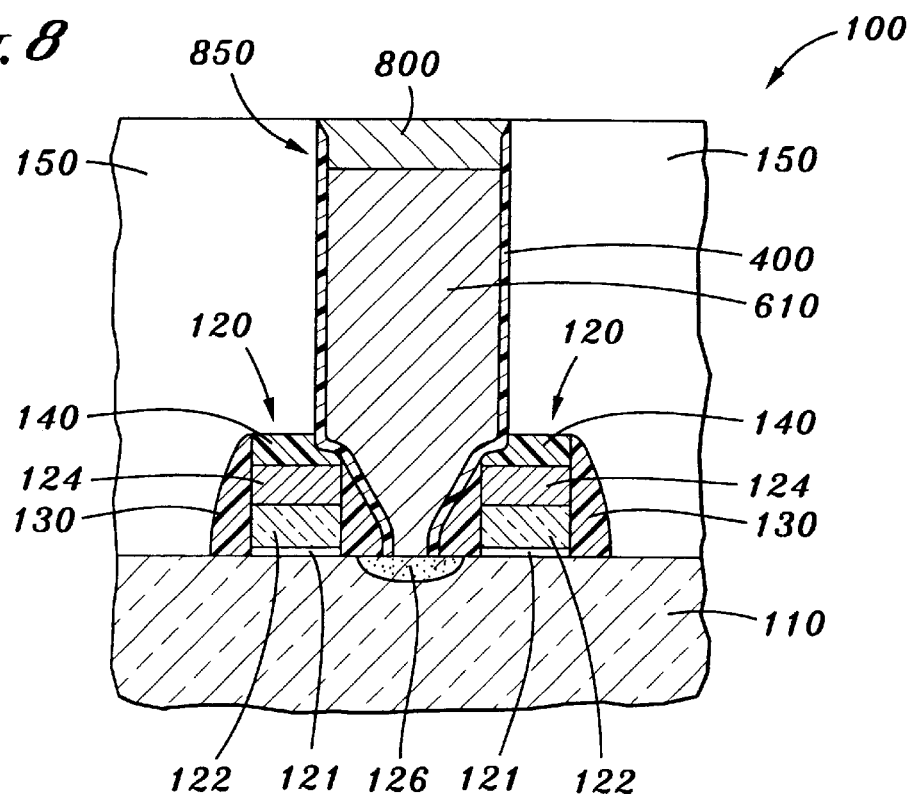
FIG. 8 shows the memory cell of FIG. 7 after a planarization or etch back process, leaving a barrier cap for the contact plug.

FIG. 8 schematically illustrates the partially fabricated memory cell 100 having the excess barrier layer material 700 removed from outside the recess 600, leaving a barrier cap 800 integrally formed with the plug portion 610, which together represent a completed contact plug 850. Preferably, this removal is performed by CMP. The skilled artisan will appreciate other suitable etch back techniques, including sputter etch and RIE.

The barrier cap 800 has several functions. For example, barrier cap 800 prevents vertical diffusion of oxygen into the plug portion 610 during subsequent process flow steps, such as formation of a high dielectric used in a memory cell capacitor. Such oxidation can significantly reduce the conductivity of the contact plug 850. The barrier cap 800 also prevents dopant diffusion, including out diffusion of electrical dopants (e.g., boron, arsenic or phosphorus) from the active area 126.

The embodiment of FIGS. 1–8 thus provides an electrical contact 850 having an insulating spacer 400 surrounding the sidewalls of the contact plug 850. The spacer 400 protects the contact plug 850 from oxidation during subsequent process flows, for example, from the highly oxidizing environments associated with the formation of high dielectric constant capacitors in memory cells. Such highly oxidizing environments could otherwise oxidize plugs of conventional construction, rendering them non-conductive. Moreover, even with state-of the art transition metal or metal oxide plugs, as utilized in the preferred embodiment, highly rich oxygen environments and high thermal energy during high k material formation (including curing anneal) can lead to oxygen diffusion through the ILD 150 to sidewalls of the plug 850. The illustrated spacers 400 prevent such diffusion from continuing through the plug 850 and into the active area 126.

Figure 9:
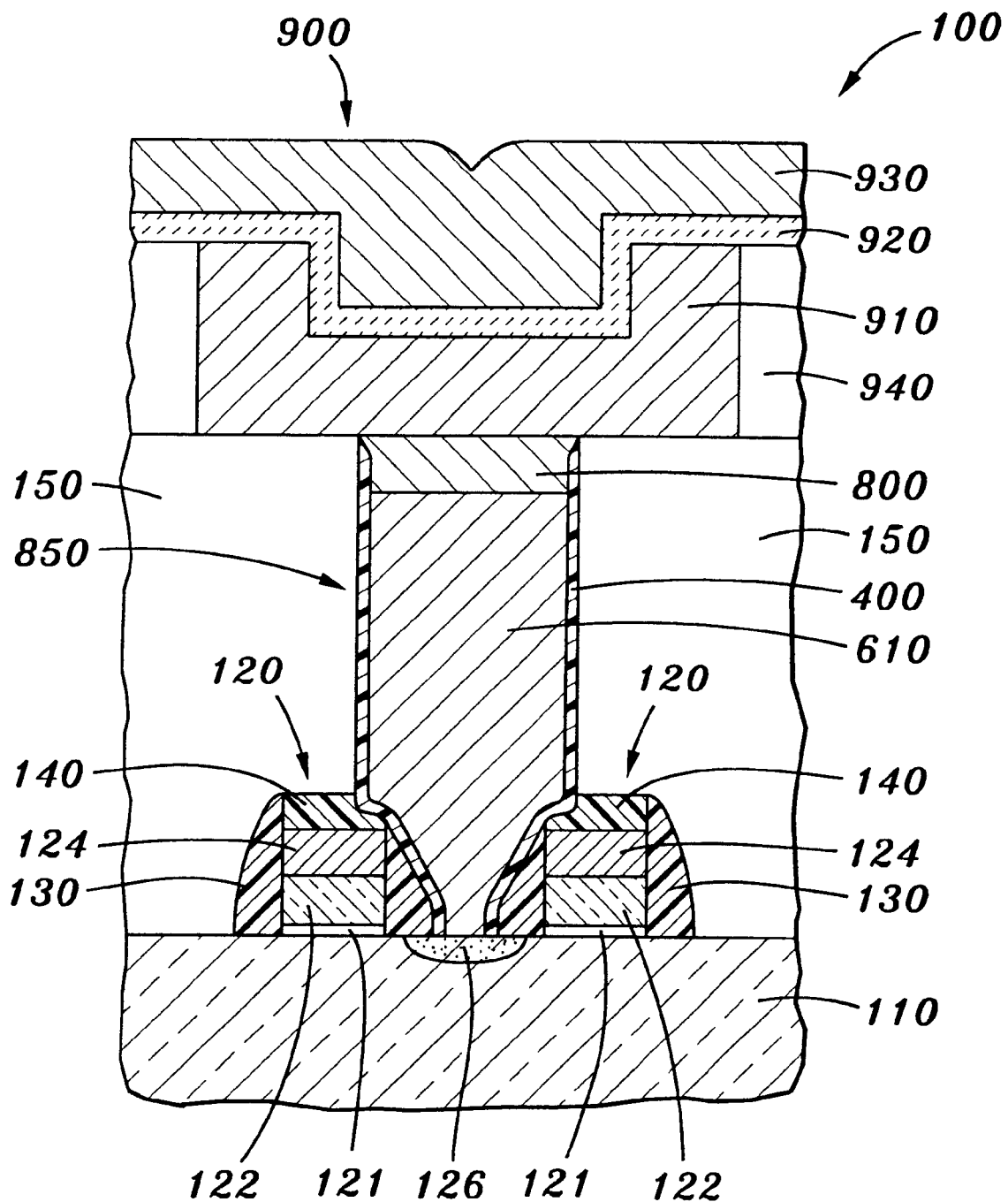
FIG. 9 shows the memory cell of FIG. 8, with a memory cell capacitor formed above the contact plug.

FIG. 9 illustrates an exemplary memory cell capacitor 900 formed over the plug 850. The memory cell capacitor 900 includes a bottom or storage electrode 910, a capacitor dielectric 920, and a top or reference electrode 930. An insulating layer 940 preferably surrounds and provides a container-shaped template for the bottom electrode 910. As discussed above, the dielectric 920 preferably comprises a material having a high dielectric constant, i.e., greater than about 10, so as to enable smaller and simpler memory cell capacitor structures. Such materials include tantalum oxide ($Ta_2O_5$), barium strontium titanate (BST), strontium titanate (ST), barium titanate (BT), lead zirconium titanate (PZT), and strontium bismuth tantalate (SBT). These materials are characterized by effective dielectric constants significantly higher than conventional dielectrics (e.g., silicon oxides and nitrides). Whereas k equals 3.9 for silicon dioxide, the dielectric constants of these new materials can range from 20 to 40 (tantalum oxide) to greater than 100 (e.g., BST, for which $k \geq 300$), and some even higher (600 to 800).

An exemplary dielectric 920 comprises SBT, deposited by chemical vapor deposition or spin-on deposition, followed by a curing anneal to crystallize the dielectric. The anneal is preferably performed between about 450° C. and 950° C. This crystallization of a complex oxide such as SBT should be performed in an oxygen ambient, preferably an $O_2$, $O_3$, $N_2O$, NO, or other oxygen-containing ambient. During this high temperature oxidation step, oxygen tends to diffuse outward from the dielectric layer 920.

The structure and material for the illustrated memory cell capacitor 900 are merely exemplary. The skilled artisan will readily appreciate the utility of the illustrated contact structure in a variety of integrated circuit designs.

FIGS. 10–15 illustrate a partially fabricated memory cell 1000 is in accordance with a second preferred embodiment. Similar features to those of the previous embodiment will be referenced by like numerals, for convenience. With reference initially to FIG. 10, the memory cell 1000 has been fabricated by process steps similar to those described with respect to FIGS. 1–4, such that sidewall spacers 400 are formed in contact hole 200, as shown. In addition to the non-conductive barrier properties of the sidewall spacers 400, the memory cell 1000 of the second embodiment includes conductive liners for superior barrier properties and improved conductivity.

In particular, a metal layer 1010, preferably a refractory metal such as titanium, tungsten, titanium nitride, tungsten nitride, etc., is deposited into the contact hole 200 and over the ILD 150. The thickness of the metal layer 1010 depends on the geometry of the circuit design, and operational considerations. An upper limit on the thickness of the metal layer 1010 is influenced by a desire to avoid overconsumption of the active area 126 during subsequent annealing, as will be clear from the disclosure below. The metal layer 1010 should be thick enough, however, to react with silicon and produce a silicide layer which is sufficient to consume any native oxide on the surface of the substrate 110, and to provide good adhesive contact with a subsequently deposited layer. Additionally, the metal layer 1010 should be deposited in an appropriate thickness to cover the active area 126 at the bottom of the deep contact hole 200. Preferably, the metal layer 1010 comprises titanium with a thickness between about 25 Å and 150 Å.

With reference to FIG. 11, the substrate is then annealed to react the metal layer 1010 with the substrate 110, forming a silicide cladding 1100 over the active area 126. As the silicide cladding 1100 forms only where the metal layer 1010 contacts silicon, this process is referred to in the art as a self-aligned silicide, or "silicide," process. The silicidation reaction consumes any native oxide at the surface. This function is particularly advantageous where the filler metals, such as noble and other transition metals, do not readily react with the silicon of the preferred substrate 110. Unreacted metal is then selectively etched, typically with a selective wet etch, such that only the silicide cladding 1100 remains. This silicide cladding 1100 forms electrical contact between the active area 126 and a later-deposited layer.

Figure 12:
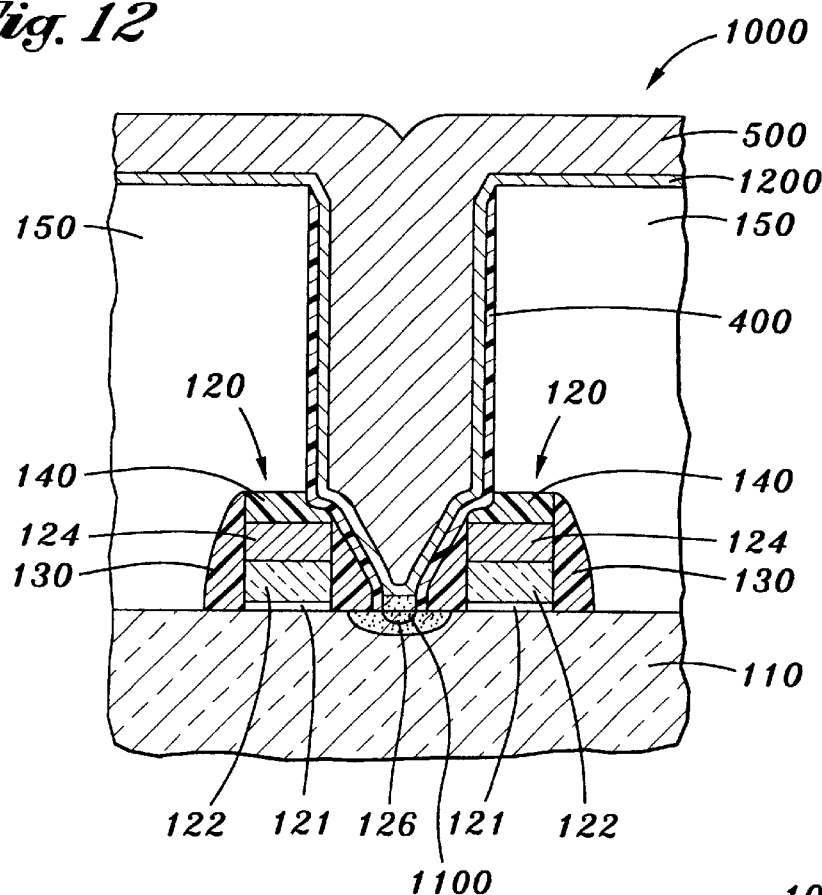
FIG. 12 shows the memory cell of FIG. 11 after deposition of a barrier layer and a conductive filler material.

FIG. 12 illustrates the partially fabricated memory cell 1000 after a conductive barrier liner 1200 has been deposited into the contact hole 200 and over the ILD 150, followed by the conductive plug material or filler 500. The conductive barrier liner 1200 preferably comprises a non-oxidizing, dense, small grain material, such as metal nitrides, metal silicides, etc., which demonstrate good barrier properties. Titanium nitride (TiN), for example, can be conformally deposited by metal organic or inorganic CVD. Another preferred material comprises TiAlN.

The conductive barrier liner 1200 is desirably thin enough to leave room for the more highly conductive filler 500, and thick enough to serve as a barrier. The preferred thickness is between about 25 Å and 300 Å for a 0.40 μm contact hole. The conductive barrier liner 1200 advantageously inhibits silicon, oxygen and dopant diffusion.

As in the previous embodiment, the filler 500 is then deposited into the contact hole 200 and over the conductive barrier layer 1200. The filler 500 can be as described with respect to FIG. 5.

Figure 13:
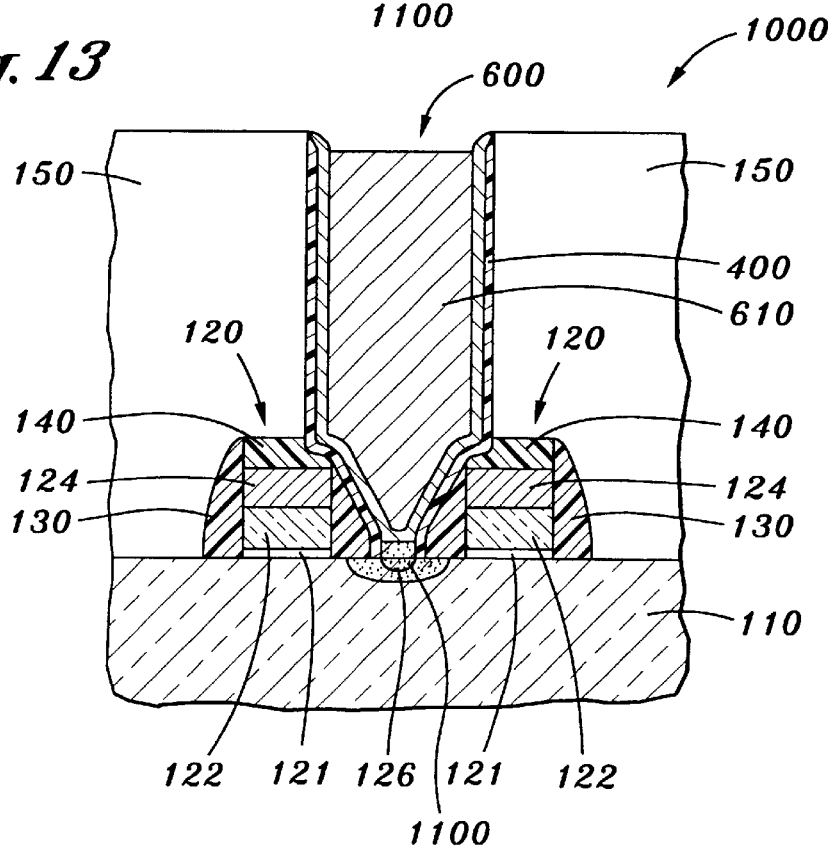
FIG. 13 shows the memory cell of FIG. 12 after an etch back or recess step.

With reference to FIGS. 13 to 15, the illustrated embodiment includes subsequent steps similar to those described above with respect to FIGS. 6 to 9. In particular, the filler 500 is recessed (FIG. 13), a conductive barrier deposited and etched back to leave a barrier cap 800 (FIG. 14), and a memory cell capacitor 900 formed over the contact plug 850 (FIG. 15). Advantageously, the capacitor 900 incorporates a high dielectric constant material 920. During the recess step, shown in FIG. 13, both the filler 500 and the conductive barrier liner 1200 are preferably recessed, and the barrier cap 800 completes the conductive barrier on all sides of the plug portion 610. Alternatively, the liner can be first deposited and etched back, and the filler deposited thereafter. In this case, only the filler needs to be recessed, such that the liner extends around the barrier cap.

Thus, the second embodiment provides the contact plug 850 which includes conductive barriers, 800, 1100, and 1200 on all sides (top, bottom and sidewalls), as well as the non-conductive barrier, or sidewall spacers 400 around the contact sidewall and extending the depth of the plug portion 610 (thereby covering the major surface of the plug portion 610). The contact plug 850 thus provides electrical contact between the substrate 110 and the overlying cell capacitor 900, while at the same time blocking potential diffusion paths to or from the substrate 110.

FIGS. 16A–19C illustrate a process flow in accordance with a third preferred embodiment. In particular, FIG. 16A illustrates a partially fabricated memory cell 1600 including a semiconductor substrate 1610 and transistor gate stacks 1620 formed thereover on either side of a transistor active area 1626. As with the previously described embodiments, the substrate 110 preferably comprises a doped monocyrstalline silicon wafer and the gate stacks 1620 each preferably comprise a gate dielectric 1621, a polysilicon electrode layer 1622, a metal strap 1624 and protective cap 1640. Notably, the gate stacks 1620 do not include sidewall spacers.

FIG. 16B illustrates a top view of the gate stacks 1620 of FIG. 16A. As shown, the stacks 1620 extend laterally across the substrate, serving as digit or word lines between transistors. While not shown, it will be understood that field isolation elements are typically also formed within the substrate, to isolate transistors from one another.

FIG. 17A illustrates the cell 1600 after a first insulating layer 1700 and a second insulating layer or ILD 1750 are deposited over the gate stacks 1620 and the silicon substrate 1610. The first insulating layer 1700 prevents direct contact between the overlying second insulating layer or ILD 1750, preferably comprising BPSG, and the gate stacks 1620. Accordingly, the first insulating layer 1700 desirably inhibits dopant diffusion from the overlying BPSG into the gate stacks 1620 and the substrate 1610. In the illustrated embodiment, the first insulating layer 1700 comprises oxide deposited from tetraethylorthosilicate, conventionally referred to as TEOS. As is known in the art, TEOS can be deposited by plasma CVD with excellent step coverage. The thickness for the first insulating layer 1700 is preferably less than about 500 Å, more preferably between about 200 Å and 300 Å, while the second insulating layer 1750 is preferably about 3,000 Å to 4,000 Å thick.

FIG. 17B is a sectional top down view of the cell 1600. The broken lines indicate that the gate stacks 1620 are hidden below the insulating layers 1750, 1700.

Though not illustrated, the insulating layers can optionally be planarized down to the level of the gate stacks at this point. CMP would abrade the ILD and the first insulating layer until the nitride caps of the gate stacks are exposed. Such a process would advantageously lower the height of the contact to be formed, for a given contact width, thus facilitating easier fill and further scaling of the integrated circuit design.

FIGS. 18A and 18B schematically illustrate the partially fabricated memory cell 1600 having a via or contact hole 2000 etched through the insulating layers 1750, 1700 to expose the underlying transistor active area 1626. FIG. 18B is a top down section of the partially fabricated memory cell 1600 of FIG. 18A, showing two such contact holes 2000 adjacent one another. Preferably, the contact holes 2000 are etched by photolithography and selective etch. The etch chemistry is selected to consume oxide without attacking the nitride cap or conductive layers of the gate stacks 1620. As in the previous embodiments, the depth of each contact hole 2000 is determined by the thickness of the insulating layers 1700, 1750, the gate spacing is preferably less than about 0.40 $\mu$m, and the contact hole width is preferably greater than the gate spacing. For example, if the gate spacing is about 0.25 $\mu$m, the contact hole 2000 is preferably about 0.4 $\mu$m wide and about 4,000 Å to 5,000 Å deep (assuming the BPSG has not be planarized down to the level of the gate stacks).

As shown, the TEOS of the illustrated first insulating layer 1700 and the nitride caps 1640 will typically be laterally recessed somewhat in the course of the etch. The conductive layers of the gate stack 1620, however, are largely undamaged by the etch.

Figure 19C:
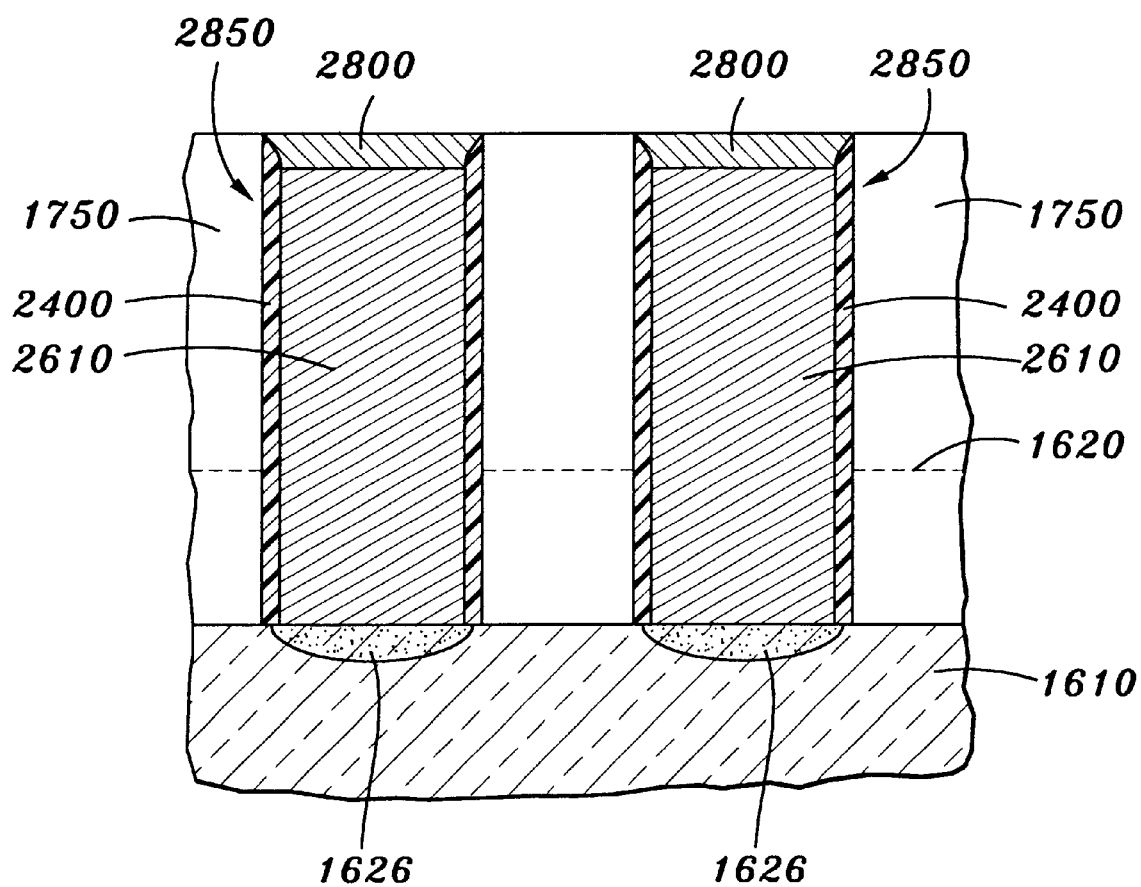
FIG. 19C is a section taken along lines 19C—19C of FIG. 19B.

FIGS. 19A–19C illustrate exemplary contact plugs 2850 of the third preferred embodiment. As illustrated, each plug 2850 includes a non-conductive spacer 2400, preferably comprising silicon nitride, and a conductive filler material 2610, preferably comprising a non-oxidizing metal or metal oxide. Additionally, a conductive barrier cap 2800 is formed over the recessed filler material 2610. The illustrated contact 2850 thus resembles the contact 850 of FIGS. 3–9, and the processes for transforming the cell 1600 from the structure of FIG. 18A to that of FIG. 19A can be as described with respect to FIGS. 3–9.

Unlike the first embodiment, however, the spacers 2400 of the first embodiment are in direct contact with the conductive layers 1622, 1624 of the gate stack 1620, without any intervening gate sidewall spacers. Rather than the gate spacers, only the non-conductive spacers 2400 lining the contact hole 2000 (or surrounding the contact plug 2850) electrically insulate the contact plug 2850 from the gate stacks 1620. This electrical insulation is provided only at the contacts. In areas between transistors, where the gate stack 1620 functions only as a word line, the gates are insulated only by the first and second insulating layers 1700, 1750.

Thus, only one insulating layer is provided between the conductive gate stacks 1620 and each contact 2850. In contrast, FIG. 9 shows both the gate spacer 130 and the contact spacer 400 interposed between the electrode layers 122, 124 and the contact 850. Thus, the usable space between the gate stacks 1620 is widened, relative to the process flows of the previously discussed embodiments. Omission of the gate spacers leaves more space for conductive contact material, and facilitates further scaling.

Although the foregoing invention has been described in terms of certain preferred embodiments, other embodiments will be apparent to those of ordinary skill in the art. For example, a process flow similar to that of the second embodiment (FIGS. 10–15) can be substituted into the third embodiment, thereby including a silicide cladding at the active area surface and a conductive liner. Additionally, other combinations, omissions, substitutions and modification will be apparent to the skilled artisan, in view of the disclosure herein. Accordingly, the present invention is not intended to be limited by the recitation of the preferred embodiments, but is instead to be defined by reference to the appended claims.

We claim:

1. A contact structure between a memory cell capacitor and a transistor active area within a semiconductor substrate, said contact structure comprising:

a conductive filler interposed between an active area and a memory cell capacitor;

a conductive diffusion barrier comprising, a conductive diffusion barrier liner surrounding sidewalls of the conductive filler, a conductive diffusion barrier layer interposed between the conductive filler and the active area, and a conductive diffusion barrier cap interposed between the conductive filler and the memory cell capacitor;

a silicon nitride spacer surrounding sidewalls of said conductive diffusion barrier liner; and an active area cladding forming an ohmic contact between said conductive diffusion barrier layer and the active area, wherein at least one insulating layer of at least one transistor gate contacts the silicon nitride spacer, and wherein the insulating layer includes sidewalls surrounding the transistor gate and a cap covering the transistor gate.

2. The contact structure of claim 1, wherein said conductive filler comprises a transition metal.

3. The contact structure of claim 2, wherein the transition metal is selected from the group comprising platinum, rhodium, palladium, iridium and ruthenium.

4. The contact structure of claim 1, wherein said conductive filler comprises a conductive oxide.

5. The contact structure of claim 1 wherein said cladding comprises a silicide layer.

6. The contact structure of claim 1 wherein said conductive diffusion barrier liner comprises titanium nitride.

7. The contact structure of claim 1 wherein said conductive diffusion barrier liner comprises tungsten nitride.

8. The contact structure of claim 1, having a width of less than or equal to about 0.40 $\mu$m.

9. The contact structure of claim 1, wherein said memory cell capacitor comprises a capacitor dielectric having a dielectric constant greater than about 20.

10. The contact structure of claim 9, wherein said capacitor dielectric comprises a complex oxide.

11. The contact structure of claim 10, wherein said capacitor dielectric is selected from the group consisting of tantalum oxide, barium strontium titanate, strontium titanate, barium titanate, lead zirconium titanate, and strontium bismuth tantalate.

12. A contact structure between a memory cell capacitor and a transistor active area within a semiconductor substrate, said contact structure comprising:

a conductive filler interposed between an active area and a memory cell capacitor;

a conductive diffusion barrier comprising, a conductive diffusion barrier liner surrounding sidewalls of the conductive filler, a conductive diffusion barrier layer interposed between the conductive filler and the active area, and a conductive diffusion barrier cap interposed between the conductive filler and the memory cell capacitor;

a silicon nitride spacer surrounding sidewalls of said conductive diffusion barrier liner; and an active area cladding forming an ohmic contact between said conductive diffusion barrier layer and the active area, wherein at least one conductive portion of at least one transistor gate directly contacts the silicon nitride spacer.

13. The contact structure of claim 12, wherein said conductive filler comprises a transition metal.

14. The contact structure of claim 13, wherein the transition metal is selected from the group comprising platinum, rhodium, palladium, iridium and ruthenium.

15. The contact structure of claim 12, wherein said conductive filler comprises a conductive oxide.

16. The contact structure of claim 12 wherein said cladding comprises a silicide layer.

17. The contact structure of claim 12 wherein said conductive diffusion barrier liner comprises titanium nitride.

18. The contact structure of claim 12 wherein said conductive diffusion barrier liner comprises tungsten nitride.

19. The contact structure of claim 12, having a width of less than or equal to about 0.40 µm.

20. The contact structure of claim 12, wherein said memory cell capacitor comprises a capacitor dielectric having a dielectric constant greater than about 20.

21. The contact structure of claim 20, wherein said capacitor dielectric comprises a complex oxide.

22. The contact structure of claim 21, wherein said capacitor dielectric is selected from the group consisting of tantalum oxide, barium strontium titanate, strontium titanate, barium titanate, lead zirconium titanate, and strontium bismuth tantalate.

23. An integrated circuit, comprising:
   a semiconductor substrate having a transistor active area formed therein;
   a transistor gate formed over the substrate;
   a contact plug in electrical communication with the active area, the contact plug extending over the substrate;
   an insulating spacer surrounding sidewalls of the contact plug, wherein the insulating spacer comprises silicon nitride;
   a conductive diffusion barrier layer interposed between the insulating spacer and the contact plug and interposed between the contact plug and the active area;
   an interlevel dielectric having a different composition from the insulating spacer and surrounding the insulating spacer;
   a capacitor formed over and in electrical communication with the contact plug, the capacitor incorporating a material having a dielectric constant of greater than about 10; and
   a conductive diffusion barrier cap interposed between the contact plug and the capacitor,
   wherein the transistor gate includes a conductive portion directly contacting the insulating spacer.

24. The integrated circuit of claim 23, further comprising an active area cladding interposed between the conductive diffusion barrier layer and the active area.

25. The integrated circuit of claim 23, wherein the contact plug comprises a metallic filler material.

26. The integrated circuit of claim 25, wherein the filler material comprises a transition metal.

27. The integrated circuit of claim 25, wherein the filler material comprises a conductive metal oxide.

28. The integrated circuit of claim 23, wherein the conductive diffusion barrier layer comprises a metal nitride.

29. The integrated circuit of claim 23, wherein said capacitor defines a container shape.

30. The integrated circuit of claim 29, wherein said capacitor defines a crown shape.

31. The integrated circuit of claim 29, wherein said capacitor defines a post shape.

32. A system including an integrated circuit, the integrated circuit comprising:
   a contact plug electrically connecting a lower circuit element and an upper circuit element, the contact plug having a lower surface contacting the lower circuit element, an upper surface contacting the upper circuit element, and a sidewall extending between the lower surface and the upper surface;
   a non-conductive diffusion barrier surrounding the contact plug sidewall, wherein the non-conductive diffusion barrier comprises silicon nitride;
   a first conductive diffusion barrier liner defining the sidewall of the contact plug;
   a second conductive diffusion barrier liner defining the lower surface of the contact plug;
   a conductive diffusion barrier cap defining the upper surface of the contact plug; and
   an interlevel dielectric surrounding the non-conductive diffusion barrier,
   wherein the integrated circuit further comprises at least one transistor gate formed over the lower circuit element and having a conductive portion directly contacting the non-conductive diffusion barrier.

33. The system of claim 32, wherein the lower surface of the contact plug further comprises an active area cladding interposed between the second conductive barrier and an active area of the lower circuit element.

34. The system of claim 32, wherein the upper circuit element comprises a capacitor incorporating a capacitor dielectric with a dielectric constant of greater than about 10.

35. The system of claim 34, wherein the contact plug comprises a oxidationresistant conductive material.

36. The system of claim 35, wherein the oxidation-resistant conductive material comprises a conductive metal oxide.

37. A memory cell in an integrated circuit, comprising:
   a capacitor having a top electrode, a bottom electrode, and a high dielectric constant dielectric between the top electrode and the bottom electrode;
   a semiconductor substrate having an active area;
   a contact plug between the bottom electrode and the active area, the contact plug comprising a oxidation-resistant conductive material;
   an interlevel dielectric layer surrounding the contact plug;
   a non-conductive spacer between the contact plug and the surrounding interlevel dielectric layer, wherein the non-conductive spacer comprises silicon nitride; and
   a conductive diffusion barrier comprising
      a first conductive diffusion barrier layer interposed between the non-conductive spacer and the contact plug,
      a second conductive diffusion barrier layer interposed between the contact plug and the active area, and
      a third conductive diffusion barrier layer interposed between the contact plug and the bottom electrode,
   wherein the memory cell further comprises one of a bit line and a word line having a conductive portion directly contacting the non-conductive spacer.

38. The memory cell of claim 37, wherein the high dielectric constant dielectric comprises BST.

39. The memory cell of claim 37, wherein the oxidation-resistant conductive material comprises a transition metal.

40. The memory cell of claim 37, wherein the oxidation-resistant conductive material comprises a conductive metal oxide.

* * * * *